United States Patent [19]

Togei

[11] 4,292,091
[45] Sep. 29, 1981

[54] METHOD OF PRODUCING SEMICONDUCTOR DEVICES BY SELECTIVE LASER IRRADIATION AND OXIDATION

[75] Inventor: Ryoiku Togei, Machida, Japan
[73] Assignee: VLSI Technology Research Association, Kawasaki, Japan
[21] Appl. No.: 124,467
[22] Filed: Feb. 25, 1980
[30] Foreign Application Priority Data
  Feb. 28, 1979 [JP] Japan ................. 54-22934
[51] Int. Cl.³ ............... H01L 21/26; H01L 21/263
[52] U.S. Cl. .................. 148/1.5; 148/187; 357/91; 427/53.1
[58] Field of Search ......... 148/1.5, 187; 357/91; 427/53.1

[56] References Cited

U.S. PATENT DOCUMENTS

| | | | |
|---|---|---|---|
| 3,585,088 | 6/1971 | Schwuttke et al. | 148/174 |
| 4,059,461 | 11/1977 | Fan et al. | 148/1.5 |
| 4,178,191 | 12/1979 | Flatley | 148/1.5 |

FOREIGN PATENT DOCUMENTS 2208271  8/1973  Fed. Rep. of Germany ..... 427/53.1

OTHER PUBLICATIONS

Révesz et al. J. Appl. Phys. 49 (1978) 5199.
Foti et al. Appl. Phys., 15 (1978) 365.
Chang, C-A, IBM-T.D.B. 20 (1977) 2459.
Revesz et al. Appl. Phys. Letts. 33 (1978) 431.
Bean et al. Appl. Phys. Letts. 33 (1978) 227.
Lau et al. Appl. Phys. Letts. 33 (1978) 130.
Nomura et al., Ion Implantation in Semiconductors, Ed. S. Namba, Plenum, N.Y. 1974.

Primary Examiner—Upendra Roy
Attorney, Agent, or Firm—Staas & Halsey

[57] ABSTRACT

A method of producing a semiconductor device comprises a step of forming a field isolating oxide layer from an amorphous silicon layer by oxidation at a relatively low temperature. Prior to the oxidizing treatment, a portion of the amorphous silicon layer is recrystallized into a single-crystalline silicon layer by laser irradiation.

22 Claims, 7 Drawing Figures

METHOD OF PRODUCING SEMICONDUCTOR DEVICES BY SELECTIVE LASER IRRADIATION AND OXIDATION

BACKGROUND OF THE INVENTION

1. Field of the Invention

The present invention relates to a method of producing semiconductor devices, and more particularly to a method of selectively forming field isolation regions and active regions in the semiconductor devices.

2. Description of the Prior Art

In the technology of an integrated circuit (IC), in which many active and passive elements and connections are made in or on a semiconductor substrate, a method of forming a field isolation region, i.e. an isolation region for isolating active elements from each other in an integrated circuit, is an important subject of technical development. The field isolation region generally comprises a thick thermal-oxidized layer and is an important factor for determining an area of an integrated circuit chip and a usable area for elements. However, in a case where a thick thermal-oxidized layer is formed, there are problems as to the production time of an integrated circuit, the effects generated by high temperature treatment and the degree of evenness of the surface of the integrated circuit.

One of the conventional methods of forming the above-mentioned field isolation region, comprising a thick oxide layer, is explained with reference to FIGS. 1A and 1B. As illustrated in FIG. 1A, on a single-crystalline silicon substrate 1 there is a silicon layer 2 which is either a surface region of the substrate or a formed epitaxial layer. A patterned silicon nitride film 4, which covers a region 3 for a semiconductor element or a desired circuit element of the silicon layer, is formed by a suitable conventional method. The uncovered portion of the silicon layer 2 is oxidized to form a silicon dioxide layer, i.e. a field oxide layer 5 (FIG. 1B), by a conventional high-temperature oxidizing treatment. The patterned silicon nitride film 4 is removed as illustrated in FIG. 1B. Thereafter, for example, a MOS (metal oxide semiconductor) element or a bipolar transistor is formed at the region 3 of the silicon layer 2 by a conventional method.

In the case of the formation of the MOS element, it is possible to improve characteristics of the MOS element by using a high resistivity silicon epitaxial layer on a low resistivity, i.e. a highly-doped single-crystalline silicon substrate. In this case, for a field oxide layer to attain its function satisfactorily, so-called channel cut regions can be formed by utilizing a phenomenon of impurities diffusing backward from the substrate. However, since the field oxide layer is formed by the conventional field oxidizing treatment at a high temperature ranging from 1000° to 1200° C., preferably about 1100° C., for a period of several hours, impurity diffusion from the silicon substrate into the silicon epitaxial layer (i.e. a so-called auto-doping) is much advanced. Therefore, in expectation of the distances of the diffusion impurities, it is necessary to make the silicon epitaxial layer relatively thick. However, when such a thick silicon epitaxial layer is formed and oxidized, the field oxide layer tends to become thick, which in turn prevents increased circuit density in a semiconductor device.

An object of the present invention is to provide a method of forming a field isolating oxide layer which permits increased circuit density in a semiconductor device, together with a method of forming active regions whose resistivity can be controlled with ease, including intrinsic resistivity regions.

Another object of the present invention is to achieve thermal oxidation of silicon at a lower temperature than that required in a conventional case.

SUMMARY OF THE INVENTION

The above-mentioned objects are attained by a method of producing a semiconductor device which comprises the steps of: forming an amorphous silicon layer on a substrate, forming a patterned mask film on the amorphous silicon layer, selectivity annealing the amorphous silicon layer with a laser beam to change it into a single-crystalline silicon layer except for the masked portion of the amorphous silicon layer, removing the patterned mask film, oxidizing the remaining amorphous silicon layer to change it into a field isolating silicon oxide layer, and forming a semiconductor element or a desired circuit element in the single-crystalline silicon layer.

BRIEF DESCRIPTION OF THE DRAWINGS

The present invention and its objects will be more clearly understood from the following detailed description in connection with the accompanying drawings, in which.

DESCRIPTION OF THE PREFERRED EMBODIMENT

Figure 1A:
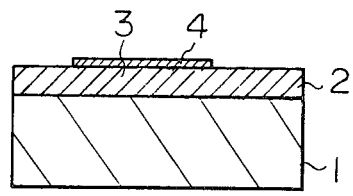
FIGS. 1A and 1B are cross-sectional views of a semiconductor device at various stages of its production by a method in accordance with the prior art.
Figure 1B:
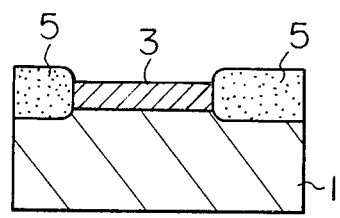
Figure 2A:
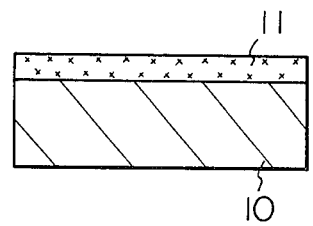
FIGS. 2A through 2E are cross-sectional views of a semiconductor device at various stages of its production by a method in accordance with the present invention.

Referring to FIG. 2A, the starting material is a single-crystalline silicon substrate 10 having a heavy concentration of an impurity which provides a low resistivity. The substrate 10 is inserted into a conventional sputtering apparatus. An amorphous silicon layer 11 is deposited to a predetermined thickness on the substrate 10, as illustrated in FIG. 2A, by selecting suitable operating conditions i.e., power, substrate temperature, etc. of the sputtering apparatus. Herein the word "amorphous silicon" indicates amorphous silicon or silicon having a structure similar to the amorphous structure.

Figure 2B:
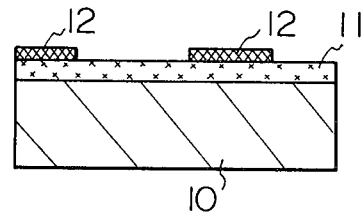

A masking film 12 made of a metal having a high melting point, such as molybdenum or other suitable material, for shielding a laser beam is deposited on the amorphous silicon layer 11 and then is patterned by a suitable lithographic process, as illustrated in FIG. 2B. Thus, a part of the amorphous silicon layer corresponding to a field isolation region of a semiconductor device to be produced is covered with the patterned masking film 12, while the remaining part of the amorphous silicon layer corresponding to a semiconductor element region and the desired circuit element region of the semiconductor device is exposed.

Figure 2C:
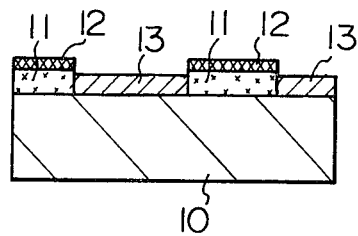

The surfaces of the exposed amorphous silicon layer 11 and the patterned masking film 12 are irradiated by either a scanning cw (continuous-wave) laser or a scanning pulsed laser beam having an output power of a few mega watts. Since the masking film 12 shields the laser beam, the portion of the amorphous silicon layer 11 laying under the masking film remains intact. On the other hand, the exposed amorphous silicon layer is laser-heated and thereby epitaxially recrystallized. Namely, the amorphous silicon layer 11 is changed into a single-crystalline silicon layer 13 by the laser irradiation, as illustrated in FIG. 2C. When the silicon substrate 11 has, for example, a (100) plane, a single-crystalline silicon layer having a (100) plane is recrystallized. The above-mentioned phenomenon is known as so-called laser annealing by a person with an ordinary skill in the art of semiconductor manufacturing technology. Laser annealing is most effectively utilized in the present invention by combining it with the field oxide layer formation.

Figure 2D:
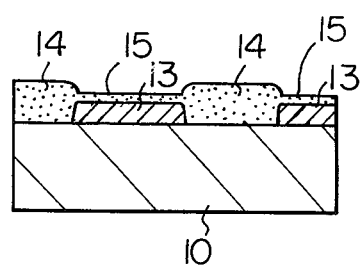

The patterned masking film 12 made of the high melting point metal is removed by using a suitable etchant. Thereafter, the silicon substrate 10 with the remaining amorphous layer and the recrystallized single-crystalline silicon layer 13 is subjected to an oxidation treatment at a relatively low temperature of 800°–1000° C. The remaining amorphous silicon layer 11 is completely oxidized to form a field isolating oxide layer 14 in a short time, while the recrystallized single-crystalline silicon layer 13 is slightly oxidized to form an oxide film (i.e. a silicon dioxide film) 15, as illustrated in FIG. 2D.

Figure 2E:
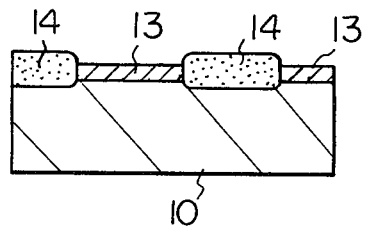

Then, the silicon substrate 10 is submerged into hydrofluoric acid to etch the field isolating oxide layer 14 and the oxide film 15. When the oxide film 15 is completely removed by etching, the silicon substrate 10 is taken out from the hydrofluoric acid. Thus, the amorphous silicon layer is converted into the single-crystalline silicon layer 13 and the field isolating oxide layer 14, as illustrated in FIG. 2E.

In the single-crystalline silicon layer 13, which is isolated from the other single-crystalline silicon layers by the field isolating oxide layer 14, a semiconductor element, e.g. an MOS element, a bipolar element or a resistance element is formed by a suitable conventional process. As a result, a desired semiconductor device is produced.

According to the present invention, since the field isolating oxide layer can be formed by the oxidizing treatment at a lower temperature (of up to 1000° C.) for a shorter time, as compared with the conventional thermal-oxidation treatment, and the laser light effectively heats the amorphous silicon layer but does not significantly heat the silicon substrate, the substrate is not heated to the high temperature (above 1100° C.), at which a conventional thermal-oxidation treatment is carried out. Although the concentration of impurities of the silicon substrate is quite high, the amount of impurity autodoped into the recrystallized single-crystalline silicon layer is very small.

Therefore, it is possible to produce a semiconductor device by using a heavily doped silicon substrate without sacrificing characteristics of the semiconductor device associated with the high resistivity layer. Since the heavily doped silicon substrate has a very low resistivity, circuit performance can be improved due to the reduced resistance of the substrate generally acts as a common bias line. Moreover, since the amount of impurities of auto-doped into the single-crystalline silicon layer is small, it is possible to make the single-crystalline silicon layer, in which the semiconductor element or the desired circuit element is formed, thinner than a single-crystalline silicon layer formed by a conventional method. Consequently, it is possible to make the width of the field isolating oxide layer narrow, so that the circuit density of the semiconductor device, i.e. IC, can be increased. According to the present invention, since the oxidation of the field isolating oxide layer is carried out at a fast oxidizing rate, there is the advantage of a shorter production time. Furthermore, the above mentioned laser annealing step can be performed after necessary impurities are introduced into selected regions in the masked parts of layer 11, with the laser annealing and field oxidation steps following. In this case, because of the low temperature and shorter time for both the field oxidation and the annealing, the profile of the introduced impurities does not change appreciably, which results in a high density of circuit elements.

It will be obvious that the present invention is not restricted to the above-described embodiment, and that many variations are possible for a person with ordinary skill in the art without departing from the scope of the present invention. For example, it is possible to use a sapphire substrate instead of the single-crystalline silicon substrate. Likewise recrystallization from a polycrystalline silicon layer into the single-crystalline silicon layer may be carried out by using the above-described method.

What is claimed is:

1. A method of producing a desired semiconductor or circuit element comprising the steps of:

forming an amorphous silicon layer on a substrate;

forming a patterned mask film on said amorphous silicon layer to shield a portion thereof, thereby defining shielded and exposed areas of said amorphous silicon layer;

selectively annealing said amorphous silicon layer with a laser beam to change said amorphous silicon layer into a single-crystalline silicon layer except for said shielded area of said amorphous silicon layer;

removing said patterned mask film;

oxidizing the remaining amorphous silicon layer to change it into a field isolating oxide layer; and forming the desired semiconductor element or circuit element in said single-crystalline silicon layer.

2. A method as claimed n claim 1, wherein a silicon dioxide layer is also formed on said single-crystalline silicon layer, simultaneously with said oxidizing step, and wherein said method further comprises a step of removing the silicon dioxide layer, which is formed on said single-crystalline silicon layer prior to said step of forming the semiconductor element or the circuit element.

3. A method as claimed in claim 1, wherein said substrate comprises a single-crystalline silicon substrate.

4. A method as claimed in claim 1, wherein said substrate comprises a sapphire substrate.

5. A method as claimed in claim 1, wherein said oxidizing step of the remaining amorphous silicon layer is carried out at a temperature in the range of 800° to 1000° C.

6. The method of claim 3, wherein said single-crystalline silicon substrate further comprises a heavy concentration of an impurity.

7. The method of claim 6, wherein said substrate is of low resistivity.

8. The method of claim 1, wherein said patterned mask film comprises a metal having a high melting point.

9. The method of claim 8, wherein said mask film comprises molybdenum.

10. The method of claim 1, wherein said laser beam comprises a continuous-wave laser beam.

11. The method of claim 1, wherein said laser beam is pulsed.

12. The method of claim 11, wherein said laser beam comprises an output power of the approximate order of 1 to 5 megawatts.

13. The method of claim 1, wherein said selective annealing step comprises scanning said amorphous silicon layer with said laser beam.

14. The method of claim 3, wherein said single-crystalline silicon substrate comprises a crystalline orientation in the (100) plane.

15. The method of claim 1, wherein said step of removing said patterned mask film uses an etchant.

16. The method of claim 2, wherein said step of silicon dioxide removal comprises application of hydrofluoric acid.

17. The method of claim 16, wherein said step of silicon dioxide removal comprises submerging said substrate into said hydrofluoric acid.

18. The method of claim 17, wherein said substrate is removed from said hydrofluoric acid as soon as said silicon dioxide layer that is atop said single-crystalline silicon layer has been removed therefrom.

19. The method of claim 1, wherein said amorphous silicon layer is relatively thin.

20. The method of claim 19, wherein said field isolating oxide layer is relatively narrow.

21. The method of claim 1, further comprising the step of implanting selected impurities into selected respective regions of said amorphous silicon layer, before said step of forming said patterned mask film.

22. A method of producing a semiconductor device or circuit element comprising the steps of:
  forming a polysilicon layer on a substrate;
  forming a patterned mask film on said polysilicon layer to shield a portion thereof, thereby defining shielded and exposed areas of said polysilicon layer;
  selectively annealing said polysilicon layer with a laser beam to change said polysilicon layer into a single-crystalline silicon layer except for said shielded area of said polysilicon layer;
  removing said patterned mask film;
  oxidizing the remaining polysilicon layer to change it into a field isolating oxide layer; and
  forming the semiconductor element or circuit element in said polysilicon layer.

* * * * *

UNITED STATES PATENT AND TRADEMARK OFFICE
CERTIFICATE OF CORRECTION

PATENT NO. : 4,292,091
DATED : September 29, 1981
INVENTOR(S) : Ryoiku Togei

It is certified that error appears in the above—identified patent and that said Letters Patent is hereby corrected as shown below:

Front page, [75] Inventor, "Machida" should be --Tokyo--;

Abstract, line 3, delete "a step of";

Col. 1, line 26, after "treatment" insert --,--;

line 49, after "highly-doped" insert --,--;

line 56, "about" should be --above--;

line 60, "distances of the" should be --distance of--;

line 61, before "impurities" insert --of the--;

Col. 2, line 14, "selectivity" should be --selectively--;

line 45, before "i.e." insert ----(--, after "etc." insert --)--;

line 66, "mega watts" should be --megawatts--;

line 68, delete "laying";

Col. 3, line 9, "with an" should be --of--;

line 19, "800°" should be --800°~--;

line 36, "an" should be --a--;

line 43, "the" should be --a--;

UNITED STATES PATENT AND TRADEMARK OFFICE
CERTIFICATE OF CORRECTION

PATENT NO. : 4,292,091    Page 2 of 2
DATED : September 29, 1981
INVENTOR(S) : Ryoiku Togei It is certified that error appears in the above—identified patent and that said Letters Patent is hereby corrected as shown below:

line 47, delete ",";

line 59, after "substrate" insert --which--;

line 61, delete "of";

Col. 4, line 19, after "Likewise" insert --,--;

line 41, "n" should be --in--.

Signed and Sealed this

Thirteenth Day of July 1982

[SEAL]

Attest:

Attesting Officer

GERALD J. MOSSINGHOFF

Commissioner of Patents and Trademarks